United States Patent
Nurikabe et al.

(10) Patent No.: US 10,320,364 B2
(45) Date of Patent: Jun. 11, 2019

(54) RADIO-FREQUENCY MODULE

(71) Applicant: Murata Manufacturing Co., Ltd., Nagaokakyo-shi, Kyoto-fu (JP)

(72) Inventors: Yuji Nurikabe, Nagaokakyo (JP); Koichi Ueno, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 224 days.

(21) Appl. No.: 15/265,911

(22) Filed: Sep. 15, 2016

(65) Prior Publication Data

US 2017/0194940 A1 Jul. 6, 2017

Related U.S. Application Data

(63) Continuation of application No. PCT/JP2015/057246, filed on Mar. 12, 2015.

(30) Foreign Application Priority Data

Apr. 8, 2014 (JP) .................. 2014-079095

(51) Int. Cl.
*H01Q 1/50* (2006.01)
*H03H 11/28* (2006.01)
(Continued)

(52) U.S. Cl.
CPC .............. *H03H 11/28* (2013.01); *H01Q 1/50* (2013.01); *H03H 7/463* (2013.01);
(Continued)

(58) Field of Classification Search
None
See application file for complete search history.

(56) References Cited

U.S. PATENT DOCUMENTS 6,489,843 B1 * 12/2002 Nishijima ............... H03F 3/602
330/128
2004/0032706 A1 2/2004 Kemmochi et al.
(Continued)

FOREIGN PATENT DOCUMENTS

JP 2004-128799 A 4/2004
JP 2011-254505 A 12/2011
(Continued)

OTHER PUBLICATIONS

English translation of Official Communication issued in corresponding International Application PCT/JP2015/057246, dated Jun. 2, 2015.

*Primary Examiner* — Trinh V Dinh

(74) *Attorney, Agent, or Firm* — Keating & Bennett, LLP

(57) ABSTRACT

A radio-frequency module includes duplexers and a phase circuit. A first transmitting-signal input terminal is connected to the duplexer, while a second transmitting-signal input terminal is connected to the duplexer. The phase circuit is connected between the first transmitting-signal input terminal and the duplexer. The phase circuit performs phase adjustment so that impedance matching between the first transmitting-signal input terminal and the duplexer is performed in the fundamental frequency band of a first transmitting signal, and so that the phase of the frequency band of a second transmitting signal in relation to the impedance characteristics of a first transmission path which ranges from the first transmitting-signal input terminal to the duplexer with the phase circuit provided therebetween appears in an open side on a Smith chart.

9 Claims, 7 Drawing Sheets

(51) Int. Cl.
  *H03H 7/46*   (2006.01)
  *H03H 11/34*  (2006.01)
  *H04B 1/04*   (2006.01)
  *H04L 5/14*   (2006.01)
  *H04B 1/00*   (2006.01)
  *H04B 1/18*   (2006.01)
  *H03H 7/38*   (2006.01)

(52) U.S. Cl.
  CPC ......... *H03H 11/344* (2013.01); *H04B 1/0057* (2013.01); *H04B 1/04* (2013.01); *H04B 1/0458* (2013.01); *H04B 1/18* (2013.01); *H04L 5/14* (2013.01); *H03H 7/38* (2013.01)

(56) References Cited

U.S. PATENT DOCUMENTS

| | | |
|---|---|---|
| 2012/0224514 A1 | 9/2012 | Shibata et al. |
| 2013/0272176 A1 | 10/2013 | Uejima |
| 2013/0329611 A1 | 12/2013 | Kitajima |
| 2014/0210569 A1* | 7/2014 | Tasaka ............... H03H 7/463 333/133 |
| 2014/0218127 A1* | 8/2014 | Nurikabe ........... H03H 9/02574 333/133 |
| 2016/0006408 A1* | 1/2016 | Murata ............... H04B 1/0057 343/852 |
| 2017/0149469 A1* | 5/2017 | Kitajima ................ H05K 1/02 |

FOREIGN PATENT DOCUMENTS

| | | |
|---|---|---|
| JP | 2012-080160 A | 4/2012 |
| JP | 2012-186623 A | 9/2012 |
| WO | 2012/093539 A1 | 7/2012 |
| WO | 2012/117992 A1 | 9/2012 |

* cited by examiner

FIG. 2A  Format: Smith Chart Center: 50 ohm
S22 1Unit
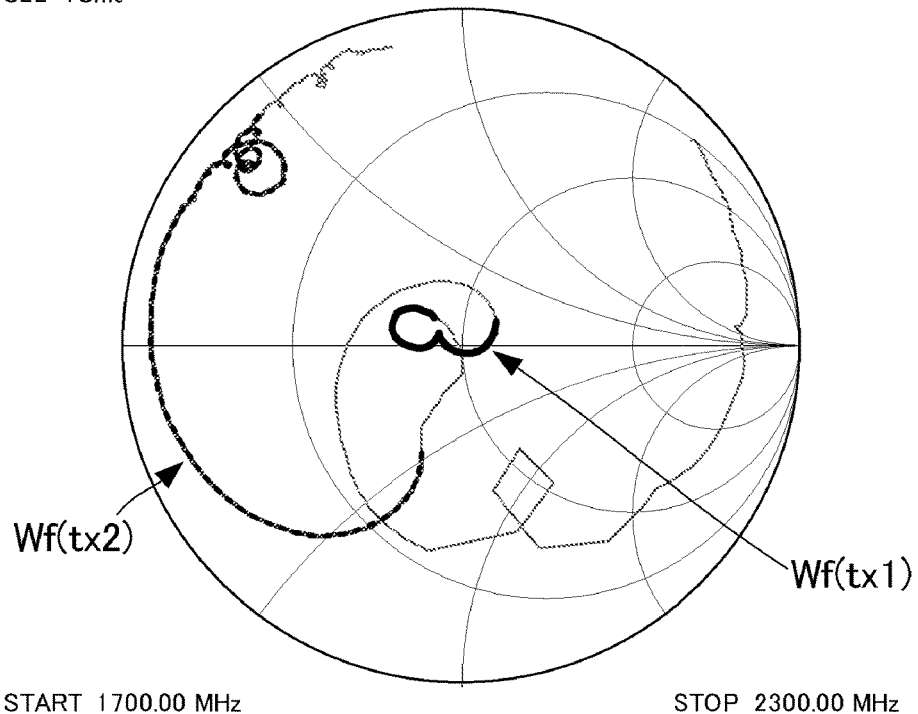
START 1700.00 MHz    STOP 2300.00 MHz
FIG. 2B  Format: Smith Chart Center: 50 ohm
S22 1Unit
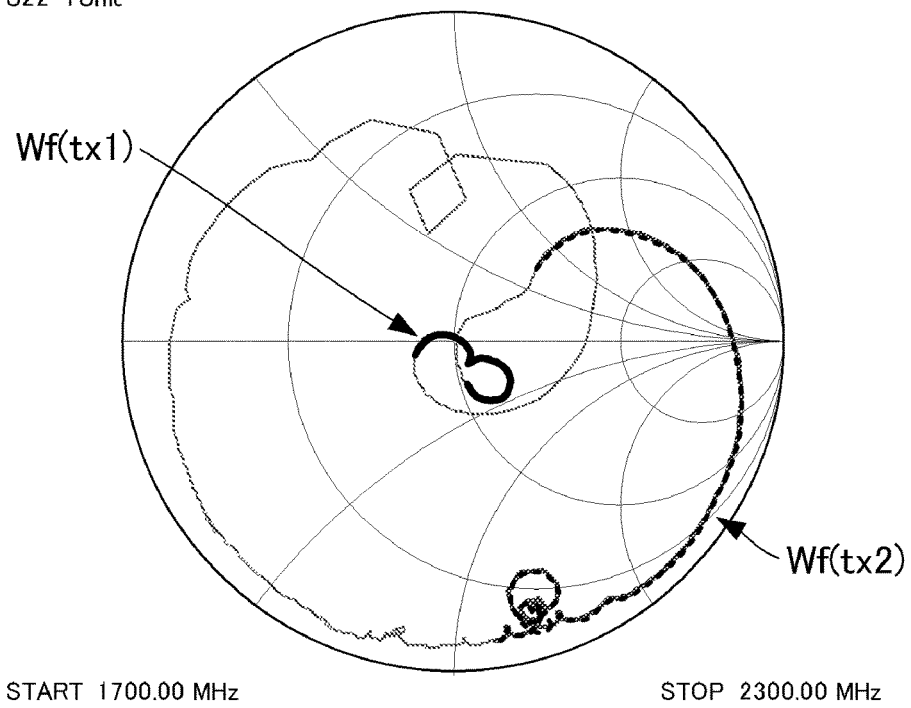
START 1700.00 MHz    STOP 2300.00 MHz

| COMMUNICATION BAND | TRANSMIT FREQUENCY BAND | RECEIVE FREQUENCY BAND |
|---|---|---|
| Band1 | 1920-1980 [MHz] | 2110-2170 [MHz] |
| Band2 | 1850-1910 [MHz] | 1930-1990 [MHz] |
| Band3 | 1710-1785 [MHz] | 1805-1880 [MHz] |

RADIO-FREQUENCY MODULE

CROSS REFERENCE TO RELATED APPLICATIONS

This application claims the benefit of priority to Japanese Patent Application 2014-079095 filed Apr. 8, 2014 and is a Continuation Application of PCT/JP2015/057246 filed on Mar. 12, 2015, the entire contents of each application are hereby incorporated herein by reference.

BACKGROUND OF THE INVENTION

1. Field of the Invention

The present invention relates to a radio-frequency module which transmits and receives radio-frequency signals of multiple communication bands.

2. Description of the Related Art

Hitherto, various radio-frequency modules which transmit and receive radio-frequency signals of multiple communication bands have been invented. For example, the radio-frequency module disclosed in Japanese Unexamined Patent Application Publication No. 2011-254505 includes a switch IC. An antenna is connected to a common terminal of the switch IC, and plural transmitting-signal input terminals and plural received-signal output terminals are connected to plural selection terminals. In the radio-frequency module disclosed in Japanese Unexamined Patent Application Publication No. 2011-254505, the switch IC performs connection switching control, so that one of the transmitting-signal input terminals or one of the received-signal output terminals can be connected to the antenna.

The radio-frequency module configured as described above is constituted by a multilayer body and mounting circuit devices. The multilayer body is constituted by dielectric layers stacked on each other having circuit patterns formed thereon. The mounting circuit devices are mounted on the multilayer body.

The transmitting-signal input terminals and the received-signal output terminals are realized by external-connecting lands arranged on the back surface of the multilayer body. The switch IC is realized by a mounting circuit device mounted on the front surface of the multilayer body.

Nowadays, there is a growing demand for decreasing the size of a radio-frequency module, such as that configured as described above, and the size of a multilayer body is also decreasing accordingly.

On the other hand, however, as the size of the multilayer body is decreasing, the distance between the external-connecting lands is becoming smaller. Accordingly, the isolation between transmission paths for transmitting plural radio-frequency signals, particularly between a transmission path for transmitting a high-power transmitting signal and another transmission path, is more likely to be decreased.

SUMMARY OF THE INVENTION

Accordingly, preferred embodiments of the present invention provide a radio-frequency module in which a decrease in isolation of a transmission path to transmit a signal is significantly reduced or prevented while a size of a multilayer body is decreased.

A radio-frequency module according to a preferred embodiment of the present invention includes a switch IC, first and second transmitting-signal input terminals, and a first-transmission-path phase circuit. The switch IC selects a selection terminal from among a plurality of selection terminals and connects the selected selection terminal to a common terminal connected to an antenna. The first transmitting-signal input terminal is connected to a first selection terminal, which is one of the plurality of selection terminals, with a first transmission path provided therebetween. The second transmitting-signal input terminal is connected to a second selection terminal, which is one of the plurality of selection terminals, with a second transmission path provided therebetween. The first-transmission-path phase circuit is connected to the first transmission path. Phase adjustment is made in the first-transmission-path phase circuit so that impedance matching is maintained in a frequency band of a first radio-frequency signal which is transmitted through the first transmission path. Phase adjustment is made in the first-transmission-path phase circuit so that a phase of a frequency band of a second radio-frequency signal transmitted through the second transmission path in relation to impedance characteristics of the first transmission path shifts to an open side on a Smith chart.

With this configuration, the isolation between the first transmission path and the second transmission path is enhanced.

A radio-frequency module according to a preferred embodiment of the present invention may include a switch IC, first and second transmitting-signal input terminals, and a second-transmission-path phase circuit. The second-transmission-path phase circuit is connected to a second transmission path. Phase adjustment is made in the second-transmission-path phase circuit so that impedance matching is maintained in a frequency band of a second radio-frequency signal which is transmitted through the second transmission path. Phase adjustment is made in the second-transmission-path phase circuit so that a phase of the frequency band of the first radio-frequency signal transmitted through a first transmission path in relation to impedance characteristics of the second transmission path shifts to an open side on a Smith chart.

With this configuration, the isolation between the first transmission path and the second transmission path is enhanced.

A radio-frequency module according to a preferred embodiment of the present invention may include a first-transmission-path phase circuit connected to the first transmission path and a second-transmission-path phase circuit connected to the second transmission path. The first-transmission-path phase circuit maintains impedance matching in a frequency band of a first radio-frequency signal which is transmitted through the first transmission path. Phase adjustment is made in the first-transmission-path phase circuit so that a phase of a frequency band of a second radio-frequency signal transmitted through the second transmission path in relation to impedance characteristics of the first transmission path shifts to an open side on a Smith chart. The second-transmission-path phase circuit maintains impedance matching in the frequency band of the second radio-frequency signal which is transmitted through the second transmission path. Phase adjustment is made in the second-transmission-path phase circuit so that a phase of the frequency band of the first radio-frequency signal transmitted through the first transmission path in relation to impedance characteristics of the second transmission path shifts to an open side on a Smith chart.

With this configuration, the isolation between the first transmission path and the second transmission path is further enhanced.

A radio-frequency module according to a preferred embodiment of the present invention becomes more effective in a case in which the first and second transmission paths or the first and second transmitting-signal input terminals are located at positions at which the first and second transmission paths or the first and second transmitting-signal input terminals are electromagnetically coupled with each other.

A radio-frequency module according to a preferred embodiment of the present invention may include first and second transmission paths in a multilayer body including dielectric layers on which conductive patterns are provided, and first and second transmitting-signal input terminals provided on a back surface of the multilayer body.

With this configuration, the radio-frequency module has a desired shape and structure that is more effective.

A radio-frequency module according to a preferred embodiment of the present invention may include a third transmission path connected to a third selection terminal, which is one of the plurality of selection terminals of the switch IC. A frequency band of a transmitting signal of the first radio-frequency signal which is transmitted through the first transmission path overlaps a frequency band of a received signal of the second radio-frequency signal which is transmitted through a second reception path corresponding to the second transmission path. The radio-frequency module further includes a first separator including a transmit terminal connected to the first transmission path, a second separator including a transmit terminal connected to the second transmission path, and a third separator including a transmit terminal connected to the third transmission path. The first, second, and third separators include mounting components to be mounted on the multilayer body. The third separator is disposed between the first and second separators.

With this configuration, the distance between the first separator and the second separator in which overlapping frequency bands are used is increased. Accordingly, the occurrence of electromagnetic coupling between the first and second separators is significantly reduced or prevented. It is thus possible to significantly reduce or prevent a decrease in the isolation even if the frequency bands to be used overlap each other.

In a radio-frequency module according to a preferred embodiment of the present invention, the arrangement of the transmit terminal, a receive terminal, and an antenna terminal of each of the first, second, and third separators may preferably be the same when the first, second, and third separators are mounted.

With this configuration, it is possible to further reduce or prevent a decrease in the isolation between the first separator and the second separator.

In a radio-frequency module according to a preferred embodiment of the present invention, a distance between the antenna terminal of the third separator and the receive terminal of the first separator may preferably be greater than a distance between the antenna terminal of the third separator and the transmit terminal of the first separator.

With this configuration, isolation characteristics between the first separator and the third separator are enhanced.

In a radio-frequency module according to a preferred embodiment of the present invention, a distance between the antenna terminal of the second separator and the receive terminal of the third separator may preferably be greater than a distance between the antenna terminal of the second separator and the transmit terminal of the third separator.

With this configuration, isolation characteristics between the second separator and the third separator are enhanced.

According to various preferred embodiments of the present invention, it is possible to significantly reduce or prevent a decrease in the isolation of a transmission path to transmit a signal even though the size of a multilayer body is decreased.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B are Smith charts representing impedance characteristics of a radio-frequency module without a phase circuit, which is a comparative example of the radio-frequency module according to the first preferred embodiment of the present invention, and representing impedance characteristics of the radio-frequency module according to the first preferred embodiment of the present invention.

DETAILED DESCRIPTION OF THE PREFERRED EMBODIMENTS

Figure 1:
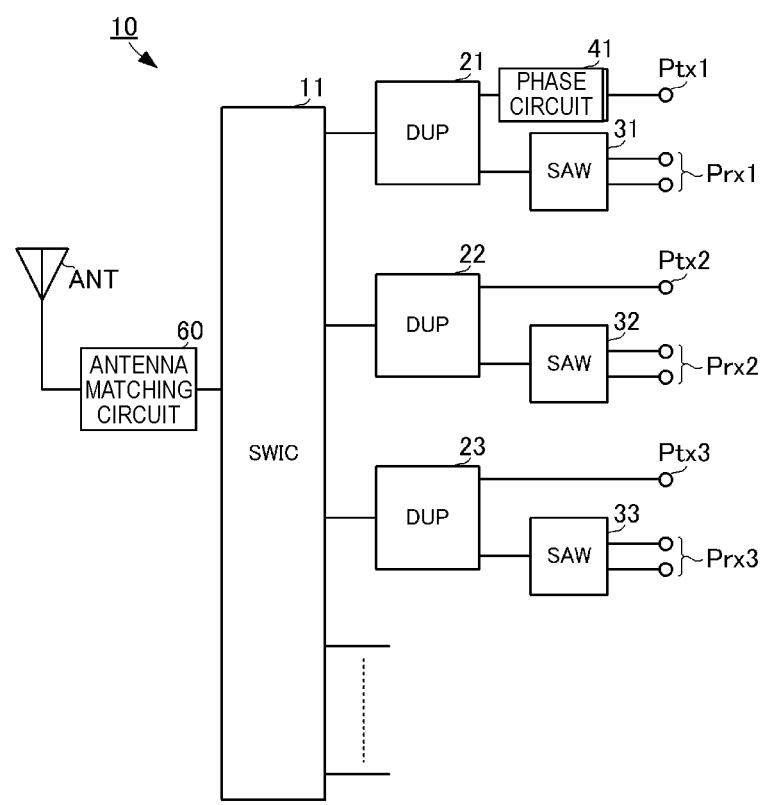
FIG. 1 is a circuit diagram illustrating the major configuration of a radio-frequency module according to a first preferred embodiment of the present invention.

A radio-frequency module according to a first preferred embodiment of the present invention is described below with reference to the drawings. FIG. 1 is a circuit diagram illustrating the major configuration of the radio-frequency module according to the first preferred embodiment of the present invention.

As shown in FIG. 1, a radio-frequency module 10 includes a switch IC 11, duplexers (separators) 21, 22, and 23, SAW filters 31, 32, and 33, a phase circuit 41, and an antenna matching circuit 60. An antenna ANT may be included in the radio-frequency module 10 or may be omitted.

The switch IC 11 includes a common terminal and plural selection terminals. The switch IC 11 selectively connects one of the plural selection terminals to the common terminal, based on a control signal input from an external source. The common terminal is connected to the antenna ANT with the antenna matching circuit 60 provided therebetween. The antenna matching circuit 60 performs impedance matching between the switch IC 11 and the antenna ANT.

A first selection terminal is connected to a first transmitting-signal input terminal Ptx1 with the duplexer 21 and the phase circuit 41 provided therebetween. The first selection terminal is also connected to a first received-signal output terminal Prx1 with the duplexer 21 and the SAW filter 31 provided therebetween.

A second selection terminal is connected to a second transmitting-signal input terminal Ptx2 with the duplexer 22 provided therebetween. The second selection terminal is also connected to a second received-signal output terminal Prx2 with the duplexer 22 and the SAW filter 32 provided therebetween.

A third selection terminal is connected to a third transmitting-signal input terminal Ptx3 with the duplexer 23 provided therebetween. The third selection terminal is also connected to a third received-signal output terminal Prx3 with the duplexer 23 and the SAW filter 33 provided therebetween.

The duplexer 21 transmits a first transmitting signal (a transmitting signal of a first communication band) input from the first transmitting-signal input terminal Ptx1 to the first selection terminal of the switch IC 11. The duplexer 21 outputs a first received signal (a received signal of the first communication band) input from the first selection terminal to the first received-signal output terminal Prx1 with the SAW filter 31 provided therebetween. The filtering function of the SAW filter 31 is set so that the fundamental frequency band of the first received signal is included within the pass band and the other frequency bands are included within the attenuation bands.

The duplexer 22 transmits a second transmitting signal (a transmitting signal of a second communication band) input from the second transmitting-signal input terminal Ptx2 to the second selection terminal of the switch IC 11. The duplexer 22 outputs a second received signal (a received signal of the second communication band) input from the second selection terminal to the second received-signal output terminal Prx2 with the SAW filter 32 provided therebetween. The filtering function of the SAW filter 32 is set so that the fundamental frequency band of the second received signal is included within the pass band and the other frequency bands are included within the attenuation bands.

The duplexer 23 transmits a third transmitting signal (a transmitting signal of a third communication band) input from the third transmitting-signal input terminal Ptx3 to the third selection terminal of the switch IC 11. The duplexer 23 outputs a third received signal (a received signal of the third communication band) input from the third selection terminal to the third received-signal output terminal Prx3 with the SAW filter 33 provided therebetween. The filtering function of the SAW filter 33 is set so that the fundamental frequency band of the third received signal is included within the pass band and the other frequency bands are included within the attenuation bands. The first, second, and third received-signal output terminals each includes a balanced terminal to output a balanced signal.

In the phase circuit 41, phase adjustment is made so that impedance matching between the first transmitting-signal input terminal Ptx1 and the duplexer 21 is performed in the fundamental frequency band of the first transmitting signal. In the phase circuit 41, phase adjustment is also made so that the phase of the frequency band of the second transmitting signal in relation to the impedance characteristics of a first transmission path which ranges from the first transmitting-signal input terminal Ptx1 to the duplexer 21 with the phase circuit 41 provided therebetween appears in the open side on a Smith chart.

FIG. 2A shows a Smith chart representing the impedance characteristics of a radio-frequency module without a phase circuit, which is a comparative example of the radio-frequency module according to the first preferred embodiment of the present invention. FIG. 2B shows a Smith chart representing the impedance characteristics of the radio-frequency module according to the first preferred embodiment of the present invention.

As shown in FIG. 2A, in the case of the radio-frequency module without the phase circuit 41, the phase of the frequency band of the second transmitting signal in relation to the impedance characteristics of the first transmission path appears in the short side on the Smith chart.

In contrast, as shown in FIG. 2B, in the case of the radio-frequency module with the phase circuit 41, the phase of the frequency band of the second transmitting signal in relation to the impedance characteristics of the first transmission path has shifted to the open side on the Smith chart. As a result of implementing such a phase shift to the open side, the isolation between the first transmission path and a second transmission path is improved.

Figure 3:
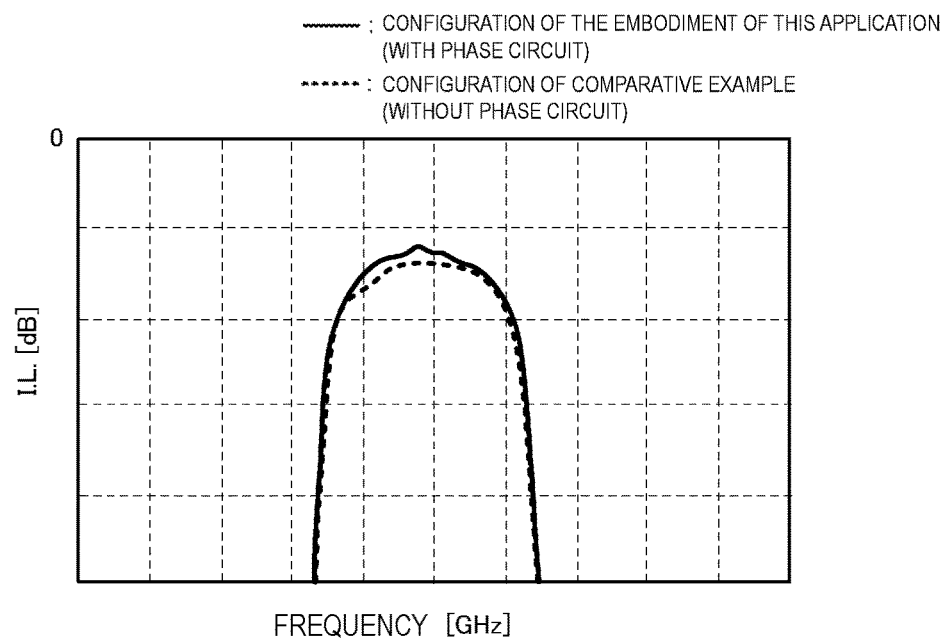
FIG. 3 is a graph illustrating frequency characteristics regarding the insertion loss of the radio-frequency module according to the first preferred embodiment of the present invention and those of the comparative example.

FIG. 3 is a graph illustrating the frequency characteristics regarding the insertion loss of the radio-frequency module according to the first preferred embodiment of the present invention and those of the comparative example.

As shown in FIG. 3, the insertion loss is able to be decreased by using the phase circuit, as in this preferred embodiment.

In this manner, by using the configuration of this preferred embodiment, it is possible to realize the radio-frequency module 10 in which the isolation between the first transmission path and the second transmission path is improved.

The configuration of this preferred embodiment becomes more effective when the radio-frequency module 10 has the following structure.

Figure 4:
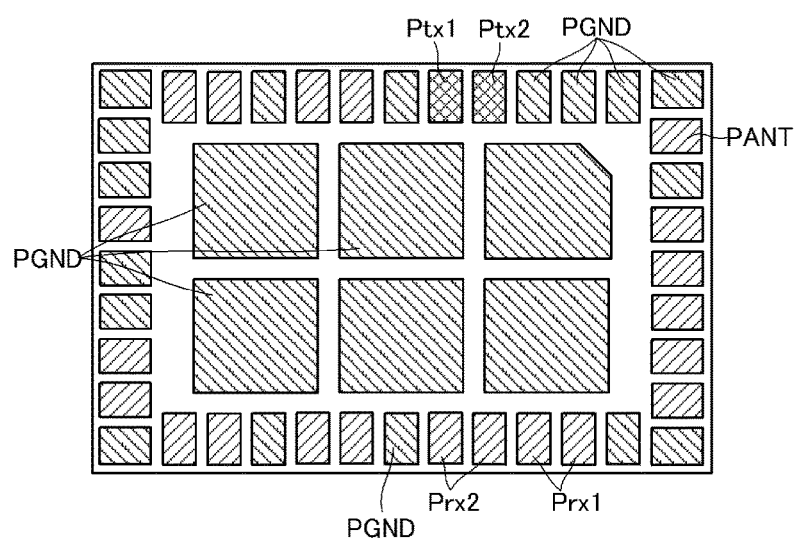
FIG. 4 is a view illustrating the arrangement pattern of external-connecting lands of the radio-frequency module according to the first preferred embodiment of the present invention.
Figure 5:
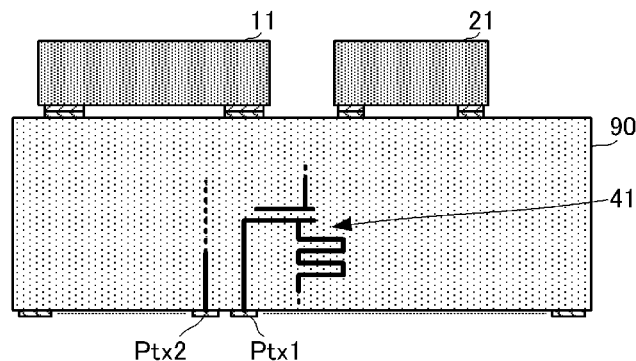
FIG. 5 is a sectional side view illustrating the structure of a multilayer body of the radio-frequency module according to the first preferred embodiment of the present invention.

FIG. 4 is a view illustrating the arrangement pattern of external-connecting lands of the radio-frequency module according to the first preferred embodiment of the present invention. FIG. 5 is a sectional side view illustrating the structure of a multilayer body of the radio-frequency module according to the first preferred embodiment of the present invention.

The radio-frequency module 10 includes a multilayer body 90 preferably having a substantially rectangular-parallelepiped shape, for example. The multilayer body 90 includes plural dielectric layers stacked on each other. On certain dielectric layers, conductive patterns are provided and define major circuit patterns other than mounting components of the switch IC 11, the duplexers 21, 22, and 23, and the SAW filters 31, 32, and 33 shown in FIG. 1, etc.

On the top surface of the multilayer body 90, mounting components defining the switch IC 11, the duplexers 21, 22, and 23, the SAW filters 31, 32, and 33, etc. are mounted. If necessary, other components such as capacitors and inductors defining the radio-frequency module 10 are also mounted.

On the back surface of the multilayer body 90, plural external-connecting lands defining the first transmitting-signal input terminal Ptx1, the second transmitting-signal input terminal Ptx2, the third transmitting-signal input terminal Ptx3, the first received-signal output terminal Prx1, the second received-signal output terminal Prx2, and the third received-signal output terminal Prx3 shown in FIG. 1, and an antenna connecting terminal PANT (see FIG. 4), which is not shown FIG. 1, are arranged.

The external-connecting land of the first transmitting-signal input terminal Ptx1 and that of the second transmitting-signal input terminal Ptx2 are disposed close to and adjacent to each other. If the external-connecting land of the first transmitting-signal input terminal Ptx1 and that of the second transmitting-signal input terminal Ptx2 are disposed close to and adjacent to each other in this manner, these external-connecting lands or wiring patterns connected thereto are electromagnetically coupled with each other. That is, the first transmission path and the second transmission path may be electromagnetically coupled with each other. However, by the provision of the above-described phase circuit 41, the isolation between the first transmission path and the second transmission path is enhanced.

The first and second transmitting-signal input terminals Ptx1 and Ptx2 (and also the third transmitting-signal input terminal Ptx3) may be separated from the first and second received-signal output terminals Prx1 and Prx2 (and also the third received-signal output terminal Prx3), as shown in FIG. 4, and external-connecting lands connected to grounds may be interposed therebetween. With this configuration, the isolation between the transmission path and the reception path is also enhanced.

Moreover, as shown in FIG. 4, the antenna connecting terminal PANT may be separated from the first, second, and third transmitting-signal input terminals Ptx1, Ptx2, and Ptx3 and the first, second, and third received-signal output terminals Prx1, Prx2, and Prx3. With this configuration, the isolation between the antenna ANT and each of the transmission path and the reception path is also enhanced.

The phase circuit 41 may include a conductive pattern within the multilayer body 90, as shown in FIG. 5. Alternatively, a mounting component to be mounted on the top surface of the multilayer body 90 may be used to provide the phase circuit 41. If the phase circuit 41 is provided within the multilayer body 90, the space for the phase circuit 41 is conserved, thus making it possible to provide an even smaller radio-frequency module 10.

Figure 6:
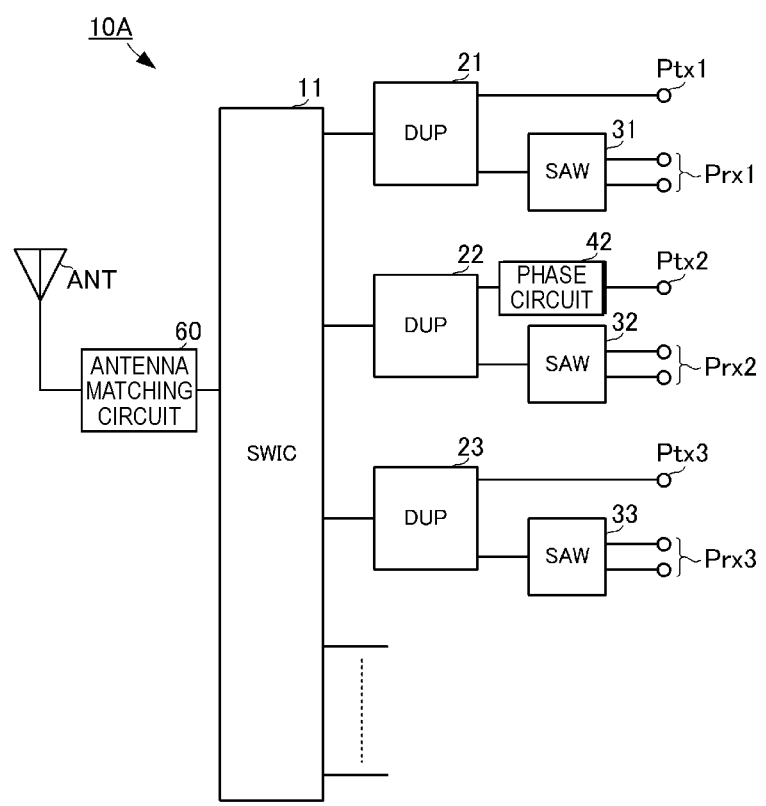
FIG. 6 is a circuit diagram illustrating the major configuration of a radio-frequency module according to a second preferred embodiment of the present invention.

A radio-frequency module according to a second preferred embodiment of the present invention is described below with reference to the drawings. FIG. 6 is a circuit diagram illustrating the major configuration of the radio-frequency module according to the second preferred embodiment of the present invention.

A radio-frequency module 10A according to this preferred embodiment is different from the radio-frequency module 10 according to the first preferred embodiment in that the phase circuit 41 is replaced by a phase circuit 42. The configurations of the other portions of the radio-frequency module 10A are the same as those of the radio-frequency module 10 according to the first preferred embodiment.

The phase circuit 42 is connected between the second transmitting-signal input terminal Ptx2 and the duplexer 22.

Figure 7:
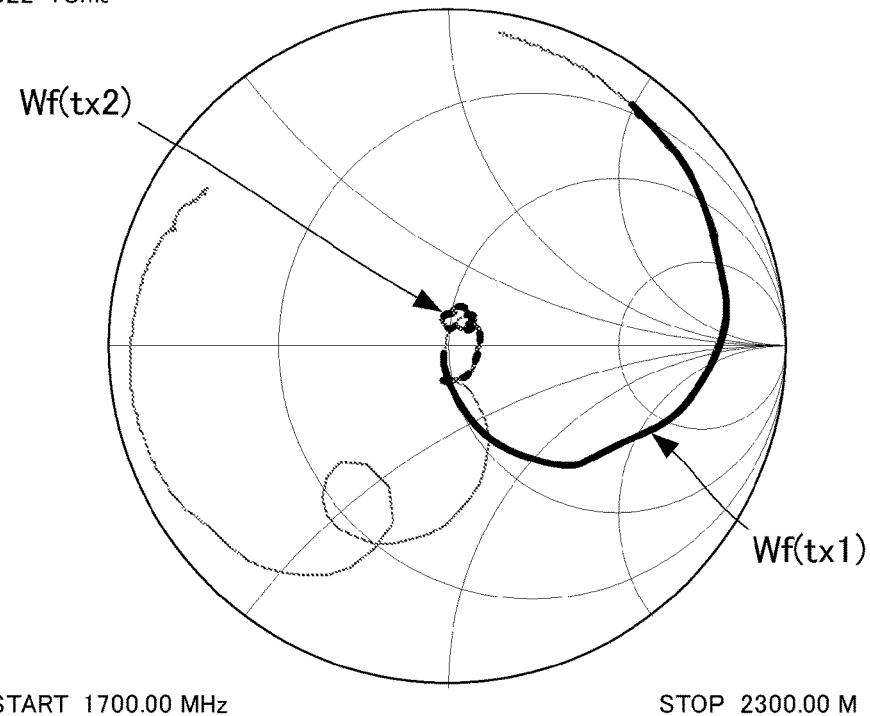
FIG. 7 shows a Smith chart representing impedance characteristics of the radio-frequency module according to the second preferred embodiment of the present invention.

FIG. 7 shows a Smith chart representing the impedance characteristics of the radio-frequency module according to the second preferred embodiment of the present invention.

As shown in FIG. 7, phase adjustment is made in the phase circuit 42 so that impedance matching is maintained in the frequency band of a second radio-frequency signal transmitted through the second transmission path and so that the phase of the frequency band of the first radio-frequency signal in relation to the impedance characteristics of the second transmission path shifts to the open side on the Smith chart.

With this configuration, the possibility that the second transmitting signal input from the second transmitting-signal input terminal Ptx2 leaks to and transmitted through the first transmission path is significantly reduced or prevented.

Thus, in a manner similar to the first preferred embodiment, it is possible to realize the radio-frequency module 10A in which the isolation between the first transmission path and the second transmission path is improved.

Only the phase circuit 41 is included in the radio-frequency module 10 according to the first preferred embodiment, and only the phase circuit 42 is included in the radio-frequency module 10A according to the second preferred embodiment. However, a radio-frequency module including both of the phase circuits 41 and 42 may be provided.

Figure 8:
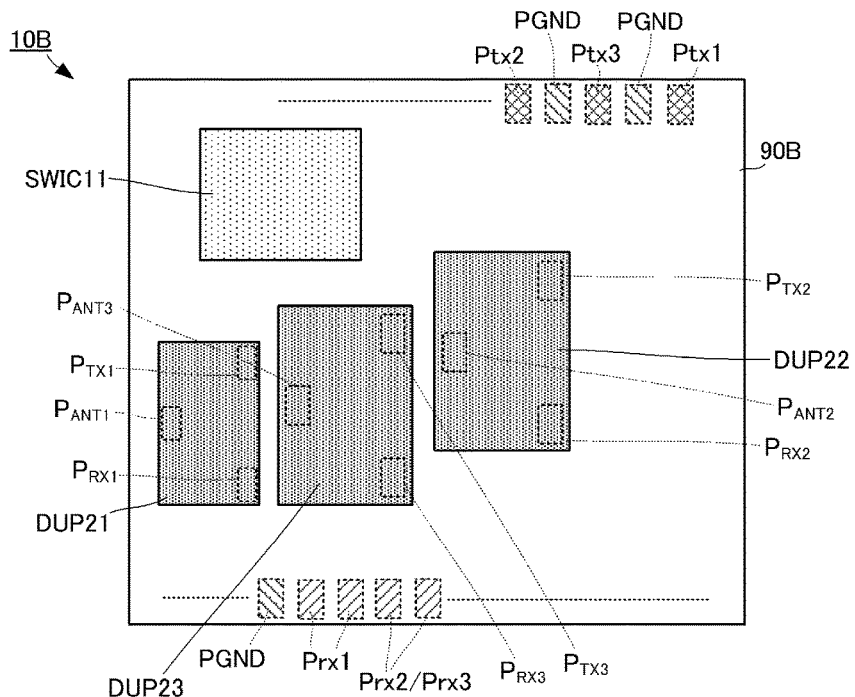
FIG. 8 is a plan view illustrating a multilayer body of a radio-frequency module according to a third preferred embodiment of the present invention.

A radio-frequency module according to a third preferred embodiment of the present invention is described below with reference to the drawings. FIG. 8 is a plan view illustrating a multilayer body of the radio-frequency module according to the third preferred embodiment of the present invention. The basic circuit configuration of a radio-frequency module 10B according to this preferred embodiment is the same as that of the radio-frequency module 10 according to the first preferred embodiment.

The radio-frequency module 10B includes a multilayer body 90B. On the top surface of the multilayer body 90B, a switch IC 11 and three duplexers 21, 22, and 23 are mounted. SAW filters and other mounting components are also mounted, though they are not shown.

The duplexers 21, 22, and 23 have the same arrangement of terminals. More specifically, the arrangement of an antenna terminal $P_{ANT1}$, a transmit terminal $P_{TX1}$, and a receive terminal $P_{RX1}$, the arrangement of an antenna terminal $P_{ANT2}$, a transmit terminal $P_{TX2}$, and a receive terminal $P_{RX2}$, and the arrangement of an antenna terminal PANTS, a transmit terminal $P_{TX3}$, and a receive terminal $P_{RX3}$ are the same. The duplexers 21, 22, and 23 are mounted on the multilayer body 90B so that the arrangements of the terminals of the duplexers 21, 22, and 23 are the same, as viewed from above.

The duplexers 21, 22, and 23 are mounted along one direction of the top surface (mounting surface) of the multilayer body 90B in order of the duplexers 21, 23, and 22. With this configuration, the duplexer 23 is interposed between the duplexers 21 and 22, so that the duplexers 21 and 22 are able to be separated from each other.

Figures 9, 10:
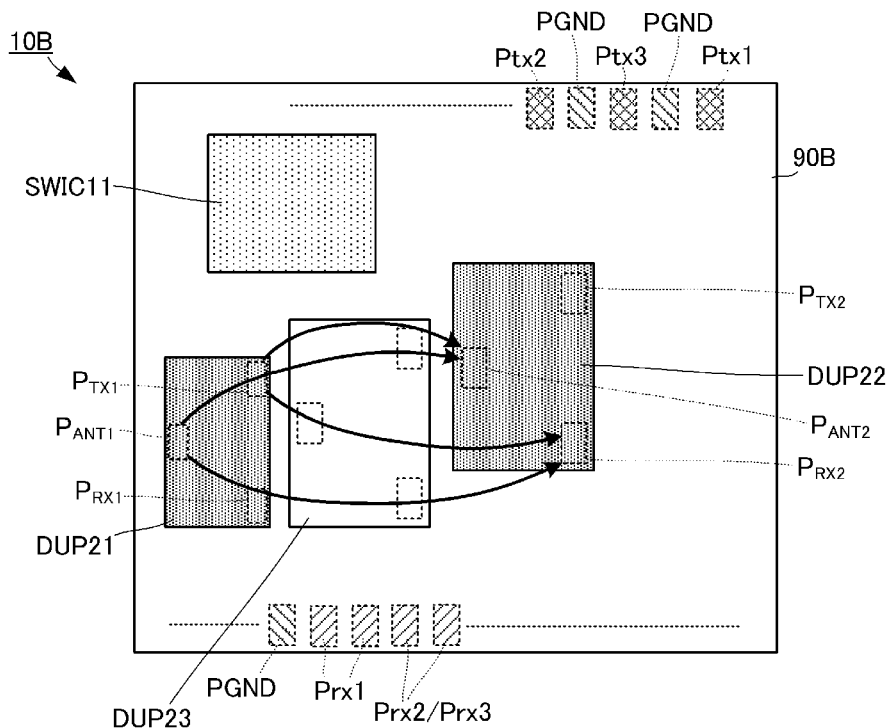
FIG. 9 is a table indicating frequency bands of multiple communication bands used in the radio-frequency module according to the third preferred embodiment of the present invention.
FIG. 10 is a view schematically illustrating the influence of a transmitting signal of a communication band Band1 (first transmitting signal) on a reception path of a communication band Band2.

FIG. 9 is a table indicating the frequency bands of multiple communication bands used in the radio-frequency module according to this preferred embodiment. Signals of the communication band Band1 are separated by the duplexer 21. Signals of the communication band Band2 are separated by the duplexer 22. Signals of the communication band Band3 are separated by the duplexer 23.

As shown in FIG. 9, the transmit frequency band of the communication band Band1 overlaps the receive frequency band of the communication band Band2, and the transmit frequency band of the communication band Band2 overlaps the receive frequency band of the communication band Band3.

However, with the configuration of this preferred embodiment, it is possible to secure the isolation between transmission paths through which signals of overlapping frequency bands are transmitted.

FIG. 10 is a view schematically illustrating the influence of a transmitting signal of the communication band Band1 (first transmitting signal) on the reception path of the communication band Band2. It is assumed that, as shown in FIG. 10, the first transmitting signal leaks to the reception path of the communication band Band2. In this case, on the top surface of the multilayer body 90B, the first transmitting signal may leak from the transmit terminal $P_{TX1}$ and the antenna terminal $P_{ANT1}$ of the duplexer 21 to the antenna terminal $P_{ANT2}$ and the receive terminal $P_{RX2}$ of the duplexer 22.

However, with the configuration of this preferred embodiment, the transmit terminal $P_{TX1}$ and the antenna terminal $P_{ANT1}$ of the duplexer 21 are separated from the antenna terminal $P_{ANT2}$ and the receive terminal $P_{TX2}$ of the duplexer 22 by a large distance, thus making it possible to significantly reduce or prevent a leakage of the first transmitting signal to the reception path of the communication band Band2. Moreover, in the configuration of this preferred embodiment, since the duplexer 23 is interposed between the duplexers 21 and 22, it is possible to further reduce or prevent a leakage of the first transmitting signal to the reception path of the communication band Band2.

Figure 11:
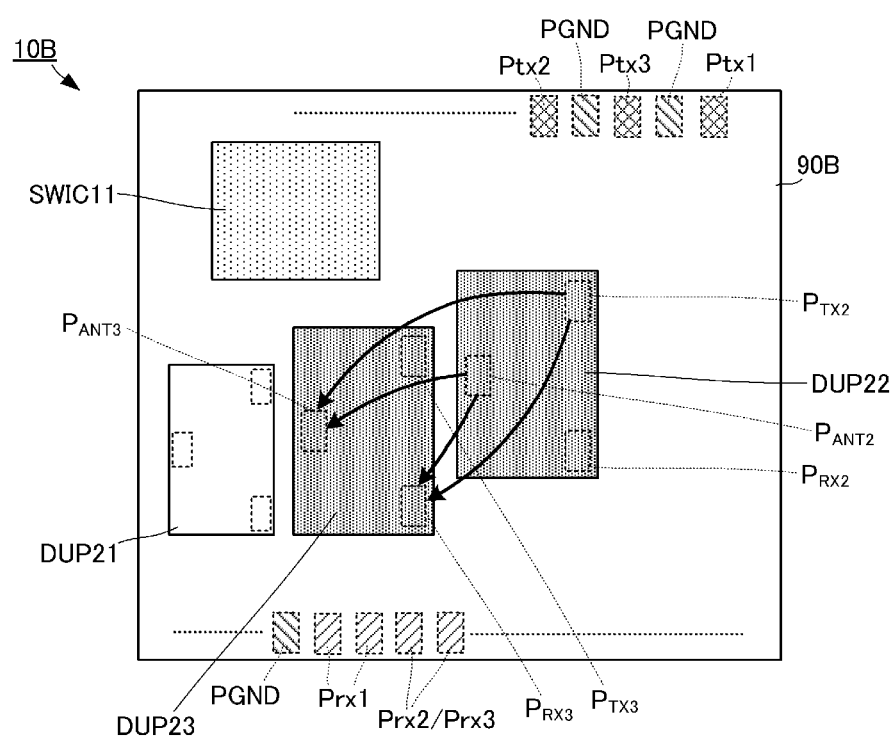
FIG. 11 is a view schematically illustrating the influence of a transmitting signal of the communication band Band2 (second transmitting signal) on a reception path of a communication band Band3.

FIG. 11 is a view schematically illustrating the influence of a transmitting signal of the communication band Band2 (second transmitting signal) on the reception path of the communication band Band3. It is assumed that, as shown in FIG. 11, the second transmitting signal leaks to the reception path of the communication band Band3. In this case, on the top surface of the multilayer body 90B, the second transmitting signal may leak from the transmit terminal $P_{TX2}$ and the antenna terminal $P_{ANT2}$ of the duplexer 22 to the antenna terminal $P_{ANT3}$ and the receive terminal $P_{RX3}$ of the duplexer 23.

However, with the configuration of this preferred embodiment, particularly with the configuration in which the arrangements of the terminals of the duplexers 21, 22, and 23 are the same, the distances from the transmit terminal $P_{TX2}$ and the antenna terminal $P_{ANT2}$ of the duplexer 22 to the antenna terminal $P_{ANT3}$ and the receive terminal $P_{RX3}$ of the duplexer 23 are greater than those of a case in which the arrangements of the terminals of the duplexers 21, 22, and 23 are not the same. As a result, a leakage of the second transmitting signal to the reception path of the communication band Band3 is significantly reduced or prevented.

In this manner, the duplexers are disposed so that the distances between the terminals to transmit and receiving signals of overlapping frequency bands are increased. It is thus possible to significantly reduce or prevent a decrease in the isolation between transmission paths through which signals of overlapping frequency bands are transmitted even though the size of a multilayer body is decreased.

In this preferred embodiment, the duplexers 21, 22, and 23 are located such that the transmit terminals $P_{TX1}$, $P_{TX2}$, and $P_{TX3}$ of the duplexers 21, 22, and 23 are positioned closer to the external-connecting lands of the first, second, and third transmitting-signal input terminals $P_{t11}$, $P_{tx2}$, and $P_{tx3}$ and such that the receive terminals $P_{RX1}$, $P_{RX2}$, and $P_{RX3}$ of the duplexers 21, 22, and 23 are positioned closer to the external-connecting lands of the first, second, and third received-signal output terminals $P_{rx1}$, $P_{rx2}$, and $P_{rx3}$. With this configuration, within the multilayer body 90B, the transmission path and the reception path are less likely to overlap each other, thus securing high isolation between the transmission path and the reception path. Additionally, by disposing an internal ground conductor between the conductive patterns of the transmission path and those of the reception path, even higher isolation is secured between the transmission path and the reception path.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module comprising:
   a switch IC that selects a selected selection terminal from among a plurality of selection terminals and connects the selected selection terminal to a common terminal connected to an antenna;
   a first transmitting-signal input terminal that is connected to a first selection terminal, which is one of the plurality of selection terminals, with a first transmission path provided therebetween;
   a second transmitting-signal input terminal that is connected to a second selection terminal, which is one of the plurality of selection terminals, with a second transmission path provided therebetween; and
   a first-transmission-path phase circuit connected to the first transmission path; wherein
   phase adjustment is made in the first-transmission-path phase circuit so that impedance matching is maintained in a frequency band of a first radio-frequency signal which is transmitted through the first transmission path; and
   phase adjustment is made in the first-transmission-path phase circuit so that a phase of a frequency band of a second radio-frequency signal transmitted through the second transmission path in relation to impedance characteristics of the first transmission path shifts to an open side on a Smith chart.

2. The radio-frequency module according to claim 1, further comprising:
   a second-transmission-path phase circuit connected to the second transmission path; wherein
   phase adjustment is made in the second-transmission-path phase circuit so that impedance matching is maintained in the frequency band of the second radio-frequency signal which is transmitted through the second transmission path; and
   phase adjustment is made in the second-transmission-path phase circuit so that a phase of the frequency band of the first radio-frequency signal transmitted through the first transmission path in relation to impedance characteristics of the second transmission path shifts to an open side on a Smith chart.

3. The radio-frequency module according to claim 1, wherein the first and second transmission paths or the first and second transmitting-signal input terminals are located at positions at which the first and second transmission paths or the first and second transmitting-signal input terminals are electromagnetically coupled with each other.

4. The radio-frequency module according to claim 3, wherein:

the first and second transmission paths are in a multilayer body that includes dielectric layers on which conductive patterns are provided; and the first and second transmitting-signal input terminals are on a back surface of the multilayer body.

5. The radio-frequency module according to claim 4, further comprising:

a third transmission path connected to a third selection terminal, which is one of the plurality of selection terminals of the switch IC, is provided;

a first separator including a transmit terminal connected to the first transmission path;

a second separator including a transmit terminal connected to the second transmission path; and a third separator including a transmit terminal connected to the third transmission path; wherein a frequency band of a transmitting signal of the first radio-frequency signal which is transmitted through the first transmission path overlaps a frequency band of a received signal of the second radio-frequency signal which is transmitted through a second reception path corresponding to the second transmission path;

the first, second, and third separators include mounting components to be mounted on the multilayer body; and the third separator is disposed between the first and second separators.

6. The radio-frequency module according to claim 5, wherein a mounted arrangement of the transmit terminal, a receive terminal, and an antenna terminal of each of the first, second, and third separators is the same.

7. The radio-frequency module according to claim 6, wherein a distance between the antenna terminal of the third separator and the receive terminal of the first separator is greater than a distance between the antenna terminal of the third separator and the transmit terminal of the first separator.

8. The radio-frequency module according to claim 6, wherein a distance between the antenna terminal of the second separator and the receive terminal of the third separator is greater than a distance between the antenna terminal of the second separator and the transmit terminal of the third separator.

9. The radio-frequency module according to claim 7, wherein a distance between the antenna terminal of the second separator and the receive terminal of the third separator is greater than a distance between the antenna terminal of the second separator and the transmit terminal of the third separator.

* * * * *